(12) United States Patent
Song et al.

(10) Patent No.: US 8,754,406 B2
(45) Date of Patent: Jun. 17, 2014

(54) ORGANIC LIGHT EMITTING DIODE DEVICE WITH A PLURALITY OF BUFFER LAYERS AND METHOD OF MANUFACTURING THE SAME

(75) Inventors: Jung-Bae Song, Yongin (KR); Sang-Pil Lee, Yongin (KR); Young-Rok Song, Yongin (KR); Beohm-Rock Choi, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 7 days.

(21) Appl. No.: 13/186,748

(22) Filed: Jul. 20, 2011

(65) Prior Publication Data
US 2012/0098008 A1   Apr. 26, 2012

(30) Foreign Application Priority Data
Oct. 22, 2010   (KR) .................. 10-2010-0103504

(51) Int. Cl.
*H01L 29/08* (2006.01)
*H01L 35/24* (2006.01)
*H01L 51/00* (2006.01)

(52) U.S. Cl.
USPC ............ 257/40; 257/79; 438/22; 438/99

(58) Field of Classification Search
None
See application file for complete search history.

(56) References Cited

U.S. PATENT DOCUMENTS

| | | | |
|---|---|---|---|
| 3,832,248 A * | 8/1974 | Bazin et al. | 438/287 |
| 2005/0161680 A1* | 7/2005 | Kawakami et al. | 257/79 |
| 2007/0108472 A1* | 5/2007 | Jeong et al. | 257/192 |
| 2007/0284586 A1* | 12/2007 | Park et al. | 257/72 |
| 2008/0197342 A1* | 8/2008 | Lee et al. | 257/40 |
| 2008/0211385 A1* | 9/2008 | Kim et al. | 313/498 |
| 2009/0267074 A1* | 10/2009 | Kwon et al. | 257/72 |

FOREIGN PATENT DOCUMENTS

| | | |
|---|---|---|
| KR | 10-2008-0065120 A | 7/2008 |
| KR | 10-2008-0088083 A | 10/2008 |
| KR | 10-2008-0110245 A | 12/2008 |

OTHER PUBLICATIONS

Kim, H. K., et al., "Method to Enhance Color Gamut up to 89% in Bottom Emission Active-Matrix Organic Light Emitting Device," *IMID '07 Digest*, 2007, pp. 43-46.

* cited by examiner

*Primary Examiner* — Andres Munoz
(74) *Attorney, Agent, or Firm* — Lee & Morse, P.C.

(57) ABSTRACT

An organic light emitting diode device includes a substrate, a transparent electrode disposed on the substrate, an emission layer disposed on the transparent electrode, a reflecting electrode disposed on the emission layer, and a gate insulating layer interposed between the substrate and the transparent electrode, the gate insulating layer being in contact with the transparent electrode and including a first inorganic dielectric layer having a thickness of about 1000 Å or less.

20 Claims, 14 Drawing Sheets

ORGANIC LIGHT EMITTING DIODE DEVICE WITH A PLURALITY OF BUFFER LAYERS AND METHOD OF MANUFACTURING THE SAME

BACKGROUND

1. Field

Example embodiments relate to an organic light emitting diode device and a method of manufacturing the same.

2. Description of the Related Art

Recently, an organic light emitting diode device (OLED device) has been paid attention to as a display device and an illumination device. An OLED device in general includes two electrodes and an emission layer disposed therebetween, and emits light when electrons injected from one electrode are combined with holes injected from the other electrode and thus forms excitons and releases energy.

The OLED device may be divided into a bottom emission structure, i.e., where light is emitted toward a substrate, and a top emission structure, i.e., where light is emitted away from the substrate. The top emission structure may exhibit limitations when applied to a large-area display device due to the resistance of a common electrode which is formed of a transparent conductor. On the other hand, the bottom emission structure may be applied to a large-area display device, but may exhibit a smaller color gamut than that of the top emission structure.

To resolve the above limitation of the bottom emission structure, a microcavity structure may be applied in a conventional OLED device. In the microcavity structure, light is repeatedly reflected between a reflective layer and a translucent layer that are apart from each other by an optical length to amplify the light in a specific wavelength region based on a constructive interference phenomenon. The color characteristic of each pixel may be improved by amplifying the light in a specific wavelength region.

A metal layer may be used as a reflective layer in a conventional microcavity structure. The metal layer, however, may be denatured because metal has a low chemical stability. Also, as the metal layer may absorb some of the light emitted from a light emission layer, luminous efficiency of the OLED device may be deteriorated.

SUMMARY

One aspect of an example embodiment is to provide an OLED device having improved color characteristics and luminous efficiency.

Another aspect of an example embodiment is to provide a method of manufacturing an OLED device with improved color characteristics and luminous efficiency.

According to one aspect of an example embodiment, an OLED device is provided that includes a substrate, a transparent electrode disposed on the substrate, an emission layer disposed on the transparent electrode, a reflecting electrode disposed on the emission layer, and a gate insulating layer interposed between the substrate and the transparent electrode, the gate insulating layer being in contact with the transparent electrode and including a first inorganic dielectric layer having a thickness of about 1000 Å or less.

The gate insulating layer may further include a second inorganic dielectric layer between the first inorganic dielectric layer and the substrate, the first and second inorganic dielectric layers having different refractive indices.

The first inorganic dielectric layer may include silicon nitride, and the second inorganic dielectric layer may include silicon oxide.

The first inorganic dielectric layer may have a thickness of about 400 to 800 Å.

The second inorganic dielectric layer may have a thickness of about 400 to 800 Å.

The OLED device may further include a plurality of buffer layers between the substrate and the gate insulating layer.

The buffer layer may include a lower buffer layer including silicon oxide, an intermediate buffer layer including silicon nitride, and an upper buffer layer including silicon oxide.

The lower buffer layer may be thicker than each of the intermediate buffer layer and the upper buffer layer.

The lower buffer layer may have a thickness of about 3000 Å or more.

Each of the intermediate buffer layer and the upper buffer layer may have thicknesses of about 200 to 800 Å.

The OLED device may further include a thin film transistor electrically connected to the transparent electrode, the thin film transistor including a semiconductor layer having a source region, a channel region and a drain region, a gate electrode overlapped with the channel region of the semiconductor layer with the gate insulating layer therebetween, and a source electrode and a drain electrode connected to the source region and the drain region, respectively, and the gate electrode including a transparent layer formed in the same layer as the transparent electrode and a metal layer disposed on the transparent layer.

According to another aspect of the present invention, a method for manufacturing an OLED device, includes forming a transparent electrode on a substrate, forming an emission layer on the transparent electrode, forming a reflecting electrode on the emission layer, and forming a gate insulating layer between the substrate and the transparent electrode, the gate insulating layer being in contact with the transparent electrode and including a first inorganic dielectric layer having a thickness of about 1000 Å or less.

The method may further include forming a plurality of buffer layers on the substrate, forming a semiconductor layer on the buffer layers, forming a second inorganic dielectric layer of the gate insulating layer, the second inorganic dielectric layer being between the buffer layers and the first inorganic dielectric layer and having a refractive index different from a refractive index of the first inorganic dielectric layer, forming a gate electrode and the transparent electrode by sequentially stacking a transparent layer and a conductive layer on the gate insulating layer and performing a patterning process, forming a source region, a channel region, and a drain region in the semiconductor layer, partially removing the buffer layers and the gate insulating layer to expose the source region and the drain region of the semiconductor layer and the transparent electrode, removing the conductive layer of the transparent electrode, forming a source electrode and a drain electrode connected to the source region and the drain region of the semiconductor layer, respectively, forming the emission layer on the transparent electrode, and forming the reflecting electrode on the emission layer.

Forming the first and second inorganic dielectric layers may include depositing a silicon nitride layer and a silicon oxide layer, respectively.

Forming the first inorganic dielectric layer may include depositing the silicon nitride layer to a thickness of about 400 to 800 Å.

Forming the second inorganic dielectric layer may include depositing a silicon oxide layer to a thickness of about 400 to 800 Å.

Forming the buffer layer may include sequentially forming a lower buffer layer including a silicon oxide, an intermediate buffer layer including a silicon nitride, and an upper buffer layer including a silicon oxide.

Forming the buffer layer may include forming the lower buffer layer thicker than each of the intermediate buffer layer and the upper buffer layer.

Forming the buffer layer may include forming the lower buffer layer to a thickness of about 3000 Å or more.

Forming the buffer layer may include forming each of the intermediate buffer layer and the upper buffer layer to a thickness of about 200 to 800 Å.

DETAILED DESCRIPTION

Figure 1:
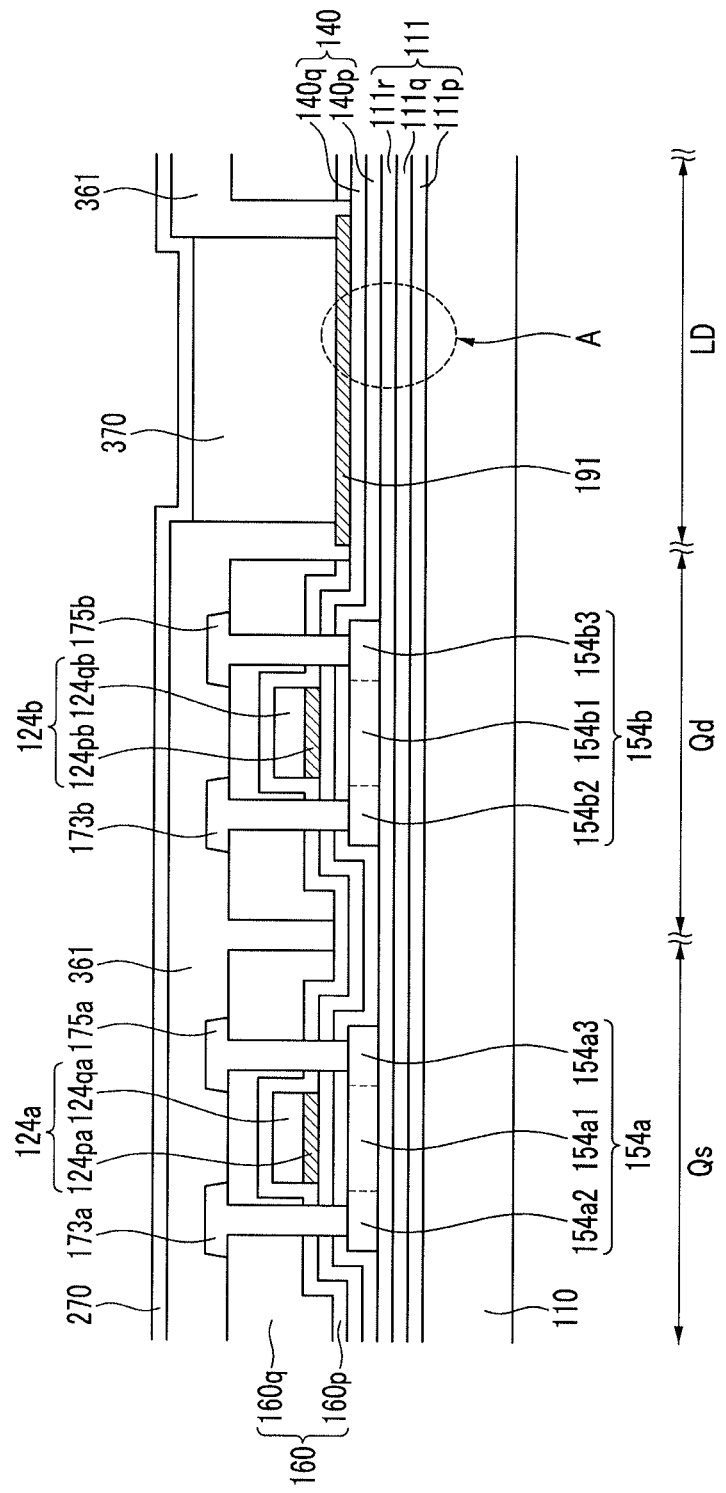
FIG. 1 illustrates a cross-sectional view of one pixel of an OLED device according to an embodiment.

Korean Patent Application No. 10-2010-0103504, filed on Oct. 22, 2010, in the Korean Intellectual Property Office, and entitled: "ORGANIC LIGHT EMITTING DIODE DEVICE AND METHOD OF MANUFACTURING THE SAME" is incorporated by reference herein in its entirety.

The present disclosure will be described more fully hereinafter with reference to the accompanying drawings, in which exemplary embodiments of this disclosure are shown. This disclosure may, however, be embodied in many different forms and is not construed as limited to the exemplary embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element or "between" elements, it can be directly on/between element or intervening elements may also be present. In contrast, when an element is referred to as being "directly on" or "directly between" elements, there are no intervening elements present.

Referring to FIG. 1, an OLED device will be described in accordance with an embodiment of this disclosure. FIG. 1 illustrates a cross-sectional view of one pixel of an OLED device according to one embodiment.

The OLED device according to one embodiment includes a switching transistor region Qs with a switching thin film transistor, a driving transistor region Qd with a driving thin film transistor, and a light emitting region LD with an OLED in each pixel.

The switching thin film transistor includes a control terminal, an input terminal, and an output terminal. The control terminal is connected to a gate line (not shown), the input terminal is connected to a data line (not shown), and the output terminal is connected to the driving thin film transistor. The switching thin film transistor transmits a data signal to the driving thin film transistor in response to a scan signal applied to the gate line.

The driving thin film transistor has a control terminal, an input terminal, and an output terminal. The control terminal is connected to the switching thin film transistor, the input terminal is connected to the driving voltage line (not shown), and the output terminal is connected to the OLED. The driving thin film transistor outputs an output current (ILD) whose intensity is different according to the voltage loaded between the control terminal and the output terminal.

The OLED includes an anode connected to the output terminal of the driving thin film transistor and a cathode connected to a common voltage. The OLED displays an image by emitting light in different intensities according to the output current (ILD) of the driving thin film transistor.

Referring to FIG. 1, a plurality of buffer layers 111 are formed over a transparent substrate 110, e.g., formed of glass, a polymer layer, or a silicon wafer. The buffer layers 111 may include a plurality of layers, and inorganic material layers having different refractive indices may be alternately stacked to form the buffer layers 111.

For example, the buffer layers 111 include a lower buffer layer 111$p$, an intermediate buffer layer 111$q$, and an upper buffer layer 111$r$. For example, the lower buffer layer 111$p$, the intermediate buffer layer 111$q$, and the upper buffer layer 111$r$ may be formed of a silicon oxide, a silicon nitride, and a silicon oxide, respectively.

The lower buffer layer 111$p$ may be thicker than the intermediate buffer layer 111$q$ and the upper buffer layer 111$r$. For example, the lower buffer layer 111$p$ may have a thickness of about 3000 Å or more, the intermediate buffer layer 111$q$ may have a thickness of about 200 to 800 Å, and the upper buffer layer 111$r$ may have a thickness of about 200 to 800 Å. With the thickness of the ranges, the buffer layers 111 may have a microcavity effect, and accordingly, the OLED device may increase the current efficiency and improve color reproducibility.

The buffer layers 111 may further include another layer under the lower buffer layer 111$p$ or on the upper buffer layer 111$r$. The buffer layers 111 may prevent moisture or impurity generated in the transparent substrate 110 from transferring to the upper part and increase crystallinity of the semiconductor by controlling the heat transferring speed when a semiconductor layer is crystallized subsequently.

Semiconductor layers 154$a$ and 154$b$ are formed in the switching transistor region Qs and the driving transistor region Qd on the buffer layer 111$s$, respectively. The semiconductor layers 154$a$ and 154$b$ include respective channel regions 154$a$1 and 154$b$1, respective source regions 154$a$2 and 154$b$2, and respective drain regions 154$a$3 and 154$b$3 disposed on both sides of the channel regions 154$a$1 and 154$b$1.

The semiconductor layers 154$a$ and 154$b$ may include a polycrystalline semiconductor, and the source regions 154$a$2 and 154$b$2 and the drain regions 154$a$3 and 154$b$3 are doped with an n-type or p-type impurity.

A gate insulating layer 140 is formed on the semiconductor layers 154$a$ and 154$b$. The gate insulating layer 140 includes a lower gate insulating layer 140$p$ and an upper gate insulating layer 140$q$. In the light emitting region LD, the lower gate insulating layer 140$p$ contacts the upper buffer layer 111$r$, and the upper gate insulating layer 140$q$ contacts a pixel electrode 191, which is to be described later.

The lower gate insulating layer 140$p$ and the upper gate insulating layer 140$q$ may be formed of inorganic dielectric materials having different refractive indices. For example, the lower gate insulating layer 140$p$ may be formed of a silicon oxide, and the upper gate insulating layer 140$q$ may be formed of a silicon nitride.

Herein, the upper gate insulating layer 140q may have a thickness of about 1000 Å or less, e.g., the upper gate insulating layer 140q may have a thickness of about 400 to 800 Å, as will be described later on. The lower gate insulating layer 140p may have a thickness of about 400 to 800 Å.

Gate electrodes 124a and 124b are formed in the switching transistor region Qs and the driving transistor region Qd on the gate insulating layer 140, respectively. A pixel electrode 191 is formed on the gate insulating layer 140 in the light emitting region LD.

The gate electrodes 124a and 124b include respective transparent layers 124pa and 124pb, i.e., layers formed of a transparent conductor, and respective metal layers 124qa and 124qb, i.e., layers disposed in the upper parts of the transparent layers 124pa and 124pb.

The transparent layers 124pa and 124pb are formed in the same layer as the pixel electrode 191, and they may be formed of a transparent conductor, e.g., indium tin oxide (ITO) or indium zinc oxide (IZO). The transparent layers 124pa and 124pb may prevent the gate insulating layer 140 from lifting or peeling by improving the adherence with the gate insulating layer 140.

The metal layers 124qa and 124qb may be formed of low-resistance metal, e.g., aluminum (Al), silver (Ag), molybdenum (Mo), and so forth, to improve conductivity and prevent a signal delay.

The pixel electrode 191 is formed in the same layer as the transparent layers 124pa and 124pb, i.e., the pixel electrode 191 and the transparent layers 124pa and 124pb are formed on the upper gate insulating layer 140q and may include the same material. The pixel electrode 191 contacts, e.g., directly contacts, the upper gate insulating layer 140q.

In the regions except the light emitting region LD, an insulation layer 160 covering the gate electrodes 124a and 124b and the gate insulating layer 140 is formed. The insulation layer 160 may include a lower insulation layer 160p formed of an inorganic material and an upper insulation layer 160q formed of an organic material, but either the lower insulation layer 160p or the upper insulation layer 160q may be omitted.

The insulation layer 160 includes a plurality of contact holes exposing the source regions 154a2 and 154b2 and the drain regions 154a3 and 154b3 of the semiconductor layers 154a and 154b. The insulation layer 160 is removed from the light emitting region LD.

In the switching transistor region Qs and the driving transistor region Qd, source electrodes 173a and 173b and drain electrodes 175a and 175b are formed on the insulation layer 160, respectively. The source electrode 173a and the drain electrode 175a in the switching transistor region Qs are connected to the source region 154a2 and the drain region 154a3 in the semiconductor layer 154a, respectively, through the contact holes. The source electrode 173b and the drain electrode 175b in the driving transistor region Qd are connected to the source region 154b2 and drain region 154b3 in the semiconductor layer 154b, respectively, through the contact holes.

A partition 361 is formed over the substrate 110 including the source electrodes 173a and 173b and the drain electrodes 175a and 175b. The partition 361 includes an opening which exposes the pixel electrode 191 in the light emitting region LD.

An organic emission layer 370 is formed on the pixel electrode 191 in the light emitting region LD. The organic emission layer 370 may be formed of an organic material which emits inherent lights of red, green and blue, or it may emit white light by combining the colors. At least one auxiliary layer (not shown) may be formed between the lower part and the upper part of the organic emission layer 370, and the auxiliary layer may be a hole injection layer (HIL), a hole transport layer (HTL), an electron injection layer (EIL), and/or an electron transport layer (ETL).

A common electrode 270 may be formed on the partition 361 and the organic emission layer 370. The common electrode 270 may be formed of a metal having a high reflection index.

In the OLED device, one of the pixel electrode 191 and common electrode 270 may be an anode, and the other is a cathode. The anode and cathode are paired with each other to flow current into the organic emission layer 370.

Also, the pixel electrode 191 and the common electrode 270 may form a microcavity structure. The microcavity structure amplifies light in a specific wavelength region based on the constructive interference phenomenon by repeatedly reflecting light between a reflective layer and a transparent (or translucent) layer which are apart from each other by an optical length. In the present embodiment, the common electrode 270 functions as the reflective layer, and the pixel electrode 191 serves as the transparent (or translucent) layer. The optical length may be controlled by making the distance between the common electrode 270 and the pixel electrode 191 different for each pixel.

The common electrode 270 greatly modifies the light emitting characteristic of the light emitted from the organic emission layer 370. Further, the light around the wavelength corresponding to the resonance wavelength of the microcavity of the modified light may be reinforced through the pixel electrode 191 and emitted toward the transparent substrate 110, while the light of the other wavelengths is suppressed.

Figure 2:
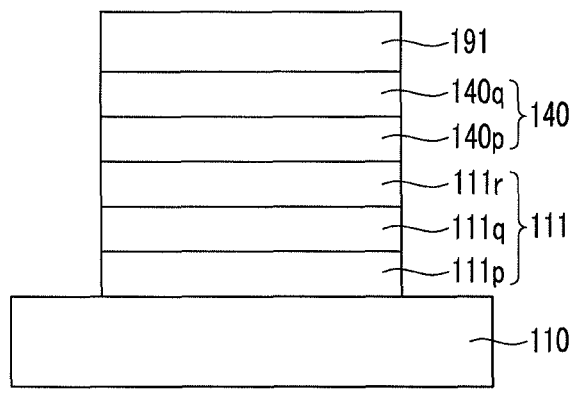
FIG. 2 illustrates a schematic enlarged view of part "A" in the OLED device shown in FIG. 1.

Hereafter, a stacking structure of the light emitting region LD in the above-described OLED device shown in FIG. 1 is described with reference to FIG. 2. FIG. 2 illustrates a magnified schematic view of part "A" in the OLED device in FIG. 1.

As described above with reference to FIG. 1, the transparent substrate 110, the buffer layers 111, the gate insulating layer 140, and the pixel electrode 191 are sequentially stacked in the light emitting region LD. Also, the common electrode 270 is a reflective electrode formed of an opaque metal, so the light emitted from the organic emission layer 370 is reflected by the common electrode 270, penetrates the pixel electrode 191, the gate insulating layer 140, and the buffer layer 111 to be emitted through the transparent substrate 110. In short, the above-described OLED device has a bottom emission structure that emits light toward the substrate.

Herein, the buffer layer 111 has a structure where the lower buffer layer 111p including a silicon oxide, the intermediate buffer layer 111q including a silicon nitride, and the upper buffer layer 111r including a silicon oxide are sequentially stacked. The gate insulating layer 140 has a structure where the lower gate insulating layer 140p including a silicon oxide and the upper gate insulating layer 140q including a silicon nitride are sequentially stacked.

As described above, the buffer layer 111 including the multiple layers and the gate insulating layer 140 including the multiple layers are disposed between the pixel electrode 191 and the transparent substrate 110. The stacked multiple layers of the buffer layer 111 and the gate insulating layer 140 refract and reflect some of the light based on the difference in the refraction rates between the layers, thereby increasing the cavity effect before light emitted from the organic emission layer 370 penetrates the pixel electrode 191 and arrives at the transparent substrate 110.

Herein, since the upper gate insulating layer 140q contacting the pixel electrode 191 has a thickness of about 1000 Å or less, a microcavity effect is induced and the efficiency is increased so as to increase color reproducibility. Therefore, light emitting characteristics of the light emitted from the organic emission layer 370 may be modified to represent colors of even narrower wavelength range, and accordingly, the color characteristic may be improved. Also, as the color characteristic is improved, luminous efficiency may be improved as well.

Hereafter, a method of manufacturing an OLED device is described with reference to FIGS. 1 and 3-13. FIGS. 3 to 13 illustrate cross-sectional views sequentially describing a method for manufacturing an OLED device in accordance with an embodiment.

Figure 3:
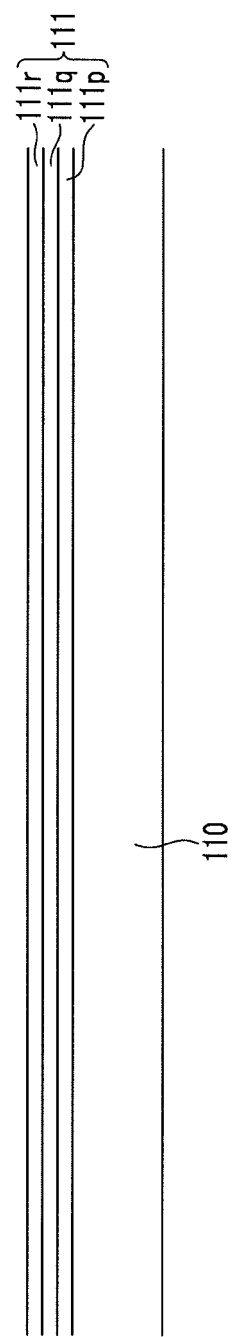
FIGS. 3 to 13 illustrate cross-sectional views of a method for manufacturing an OLED device according to an embodiment.

Referring to FIG. 3, the lower buffer layer 111p, the intermediate buffer layer 111q, and the upper buffer layer 111r are sequentially stacked on the transparent substrate 110. The lower buffer layer 111p, the intermediate buffer layer 111q, and the upper buffer layer 111r may be sequentially stacked by depositing a silicon oxide, a silicon nitride, and a silicon oxide through a chemical vapor deposition (CVD) process.

Figure 4:
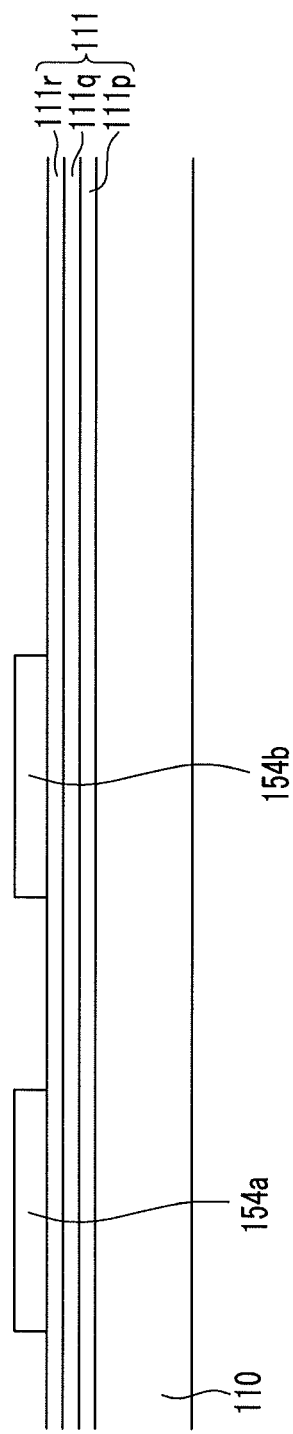

Referring to FIG. 4, an amorphous silicon layer is deposited on the buffer layer 111 through a CVD or a Physical Vapor Deposition (PVD) process and crystallized. The crystallization may be performed through an excimer laser annealing (ELA) process, a sequential lateral solidification (SLS) process, a metal induced crystallization (MIC) process, a metal induced lateral crystallization (MILC) process, or a super grain silicon (SGS) process. Subsequently, the crystallized semiconductor layer is patterned to form the semiconductor layers 154a and 154b.

Figure 5:
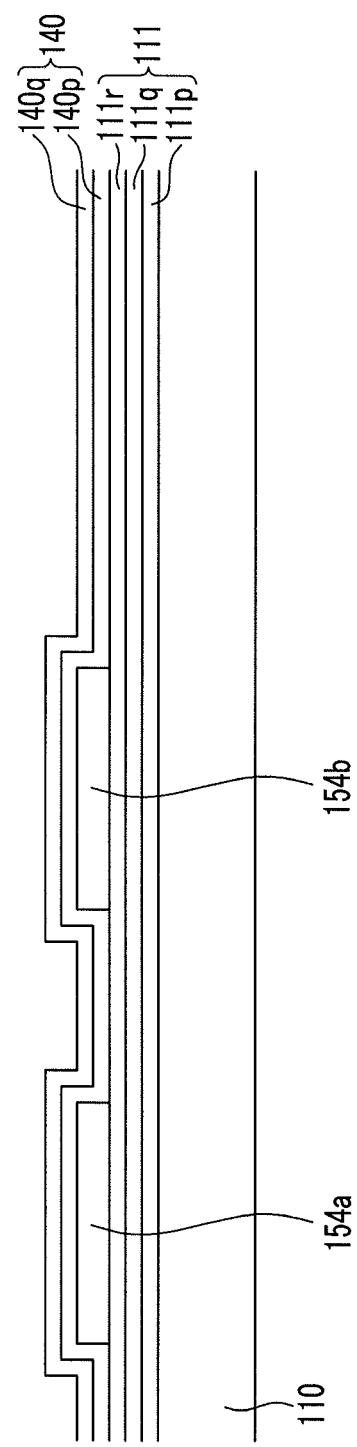

Referring to FIG. 5, a silicon oxide layer and a silicon nitride layer are sequentially deposited on the substrate structure including the semiconductor layers 154a and 154b to form the gate insulating layer 140 including the lower gate insulating layer 140p and the upper gate insulating layer 140q.

Figure 6:
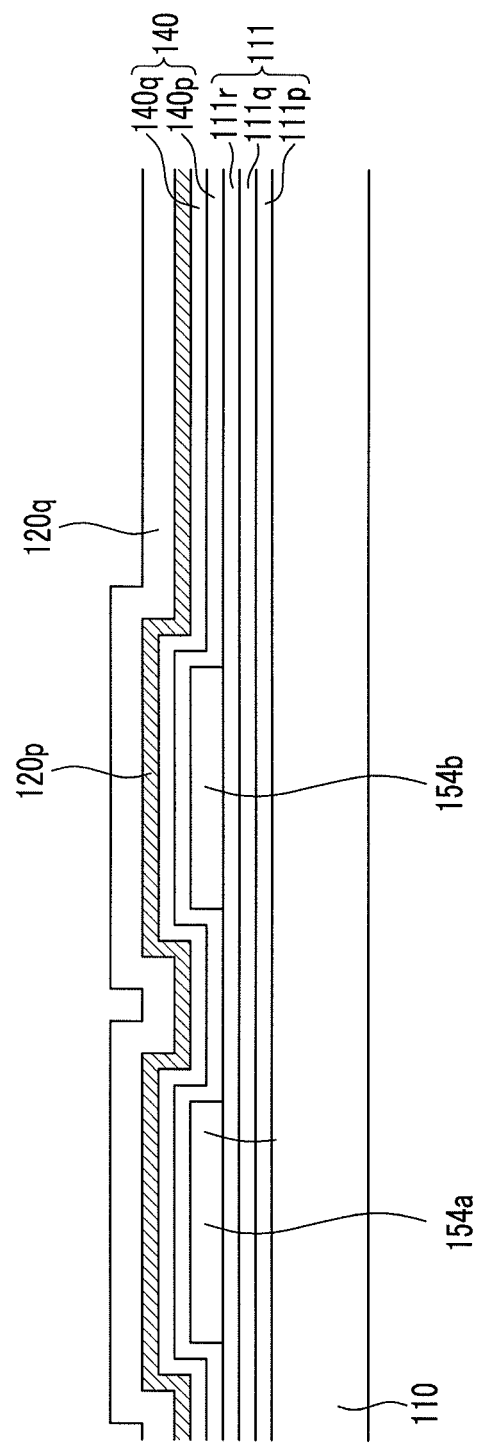

Referring to FIG. 6, a transparent conductive layer 120p and a metal layer 120q are sequentially stacked on the gate insulating layer 140.

Figure 7:
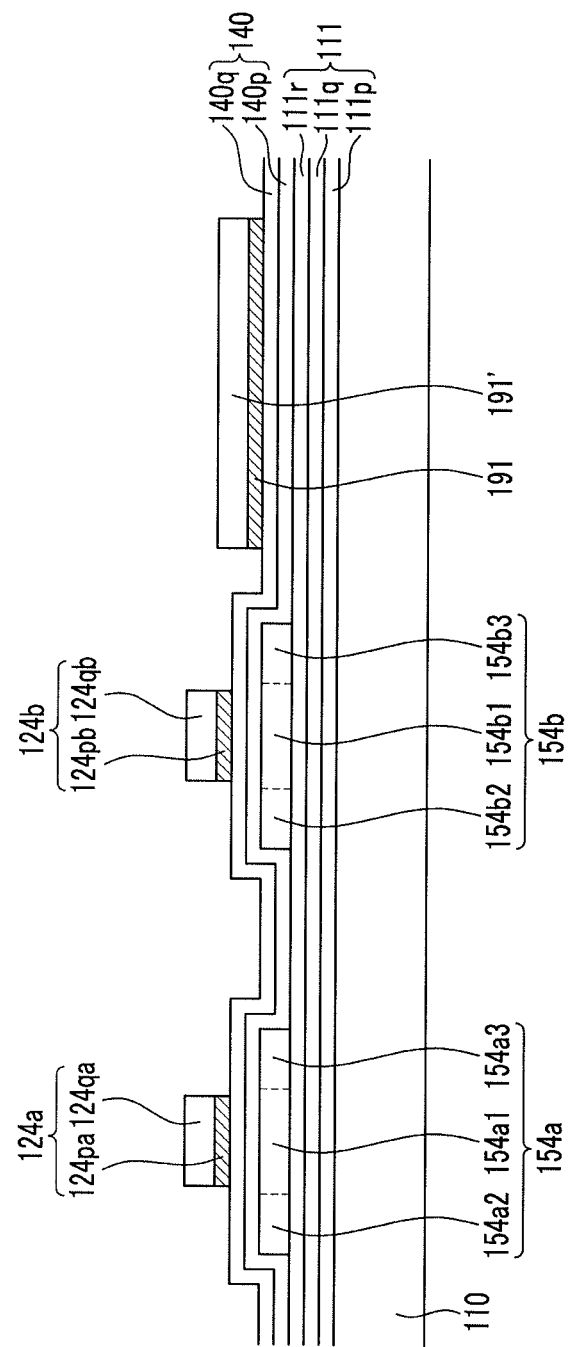

Referring to FIG. 7, gate electrodes 124a and 124b and pixel electrodes 191 and 191' are formed by performing a photolithography on the transparent conductive layer 120p and the metal layer 120q. Subsequently, source regions 154a2 and 154b2 doped with impurities, drain regions 154a3 and 154b3 doped with impurities, and channel regions 154a1 and 154b1 undoped with impurities are formed by using the gate electrodes 124a and 124b as masks and implanting an n-type or p-type impurity onto the semiconductor layers 154a and 154b.

Figure 8:
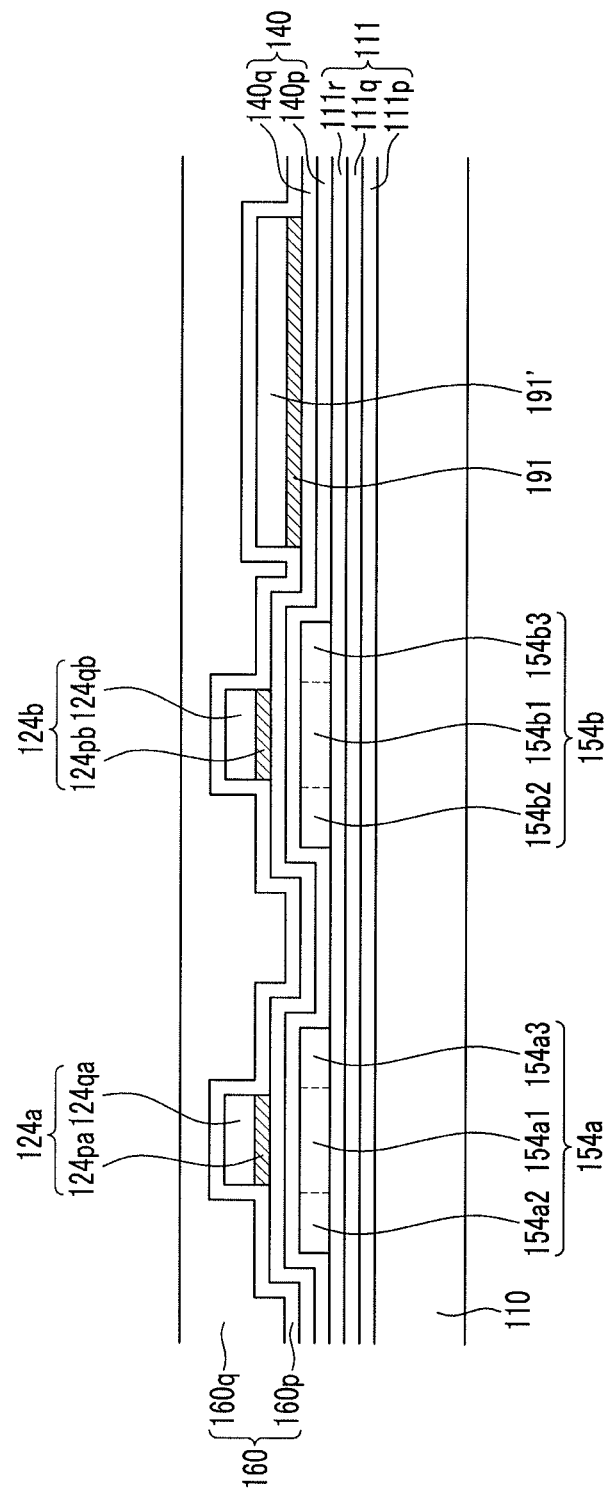

Referring to FIG. 8, the lower insulation layer 160p is formed by depositing an inorganic material on the substrate structure including the gate electrodes 124a and 124b. Then the upper insulation layer 160q is foamed by coating the upper surface of the lower insulation layer 160p with an organic material.

Figure 9:
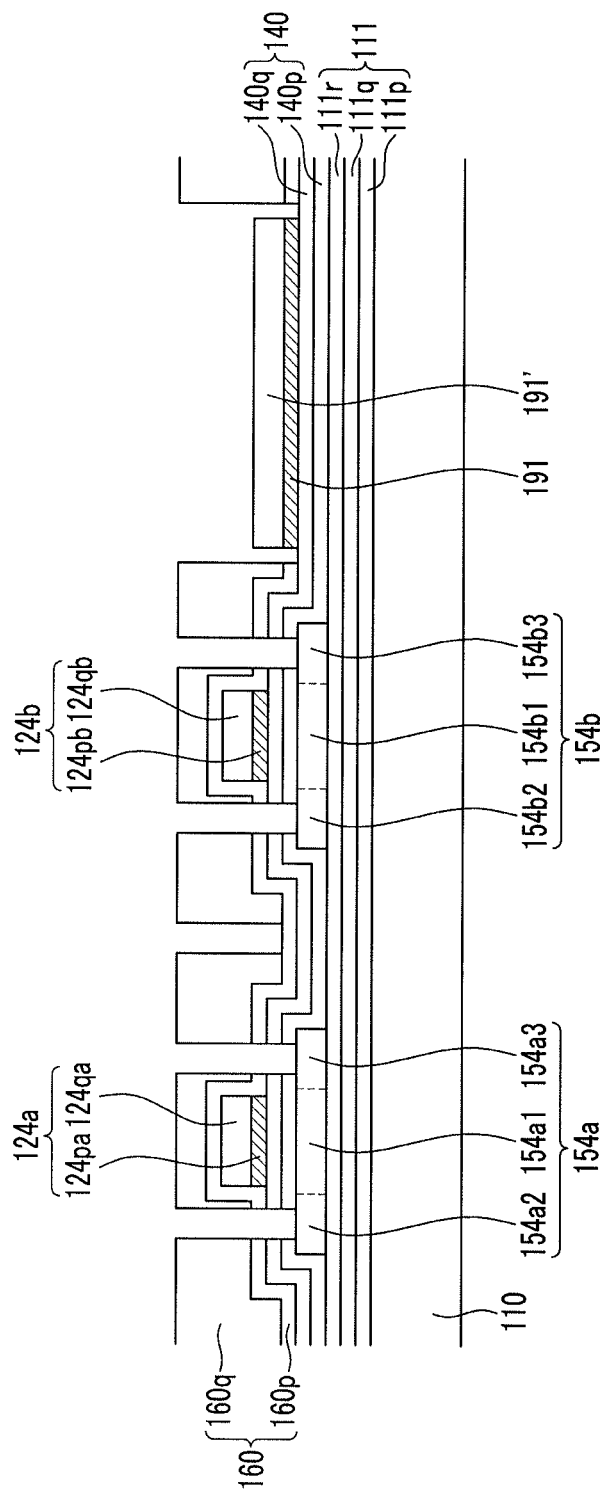

Referring to FIG. 9, the upper insulation layer 160q is patterned and then the lower insulation layer 160p and the gate insulating layer 140 are patterned to form a plurality of contact holes revealing the source regions 154a2 and 154b2 and the drain regions 154a3 and 154b3, while simultaneously revealing the pixel electrodes 191 and 191'.

Figure 10:
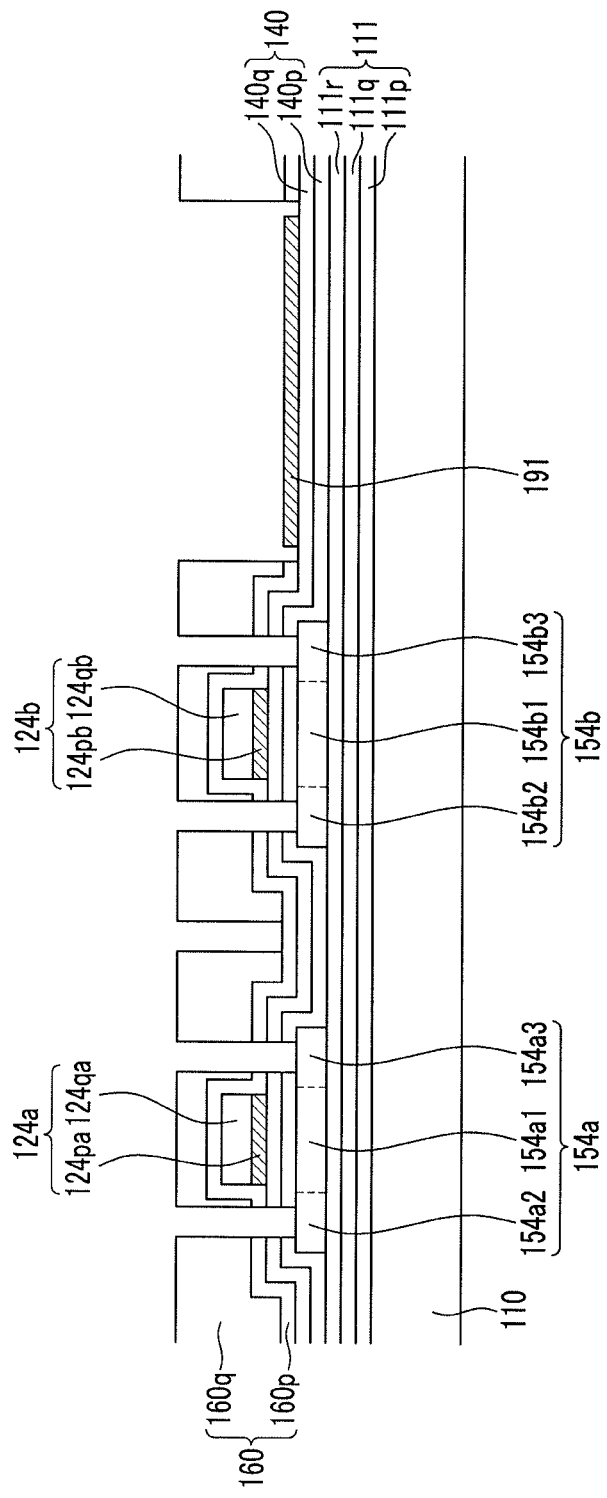

Referring to FIG. 10, the metal layer 191' of the pixel electrode is etched, i.e., the metal layer 191' is removed, leaving the transparent layer 191 of the pixel electrode behind. That is, an upper surface of the transparent layer 191 is exposed.

Figure 11:
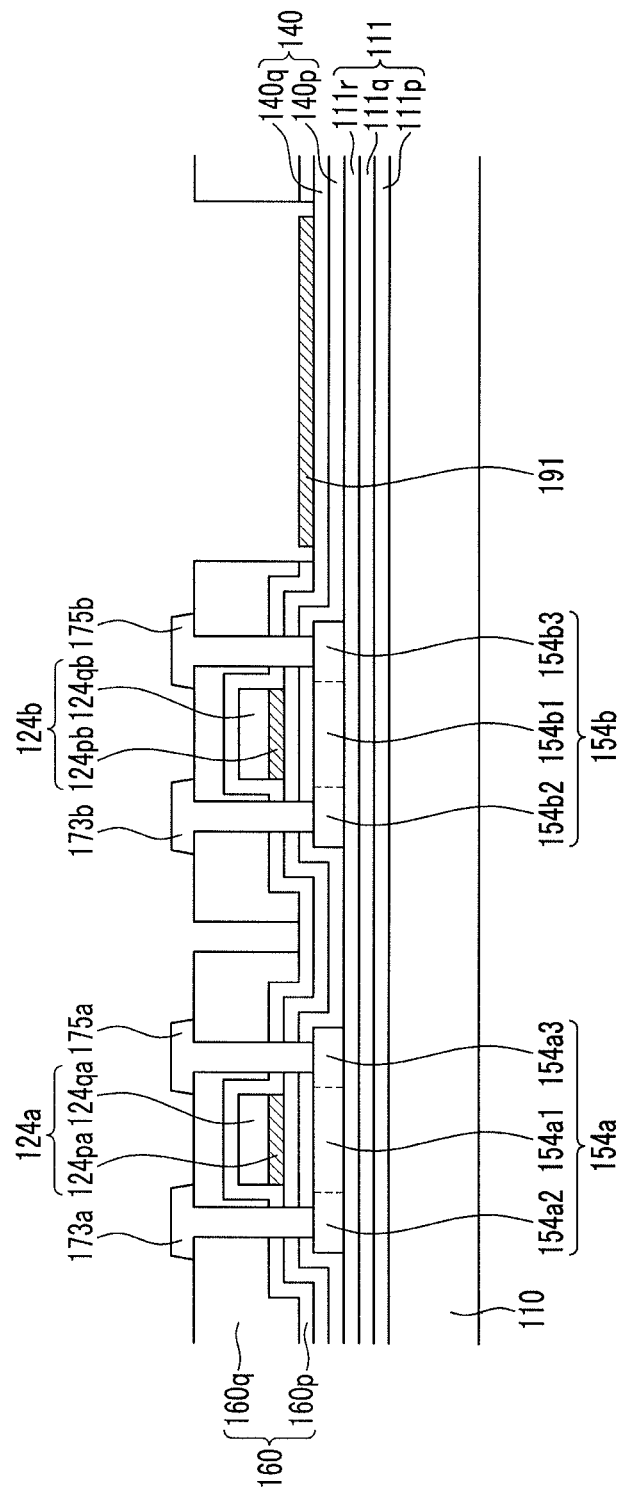

Referring to FIG. 11, source electrodes 173a and 173b connected to the source regions 154a2 and 154b2 and drain electrodes 175a and 175b connected to the drain regions 154a3 and 154b3 are formed by stacking a metal layer on the upper insulation layer 160q and performing a patterning process.

Figure 12:
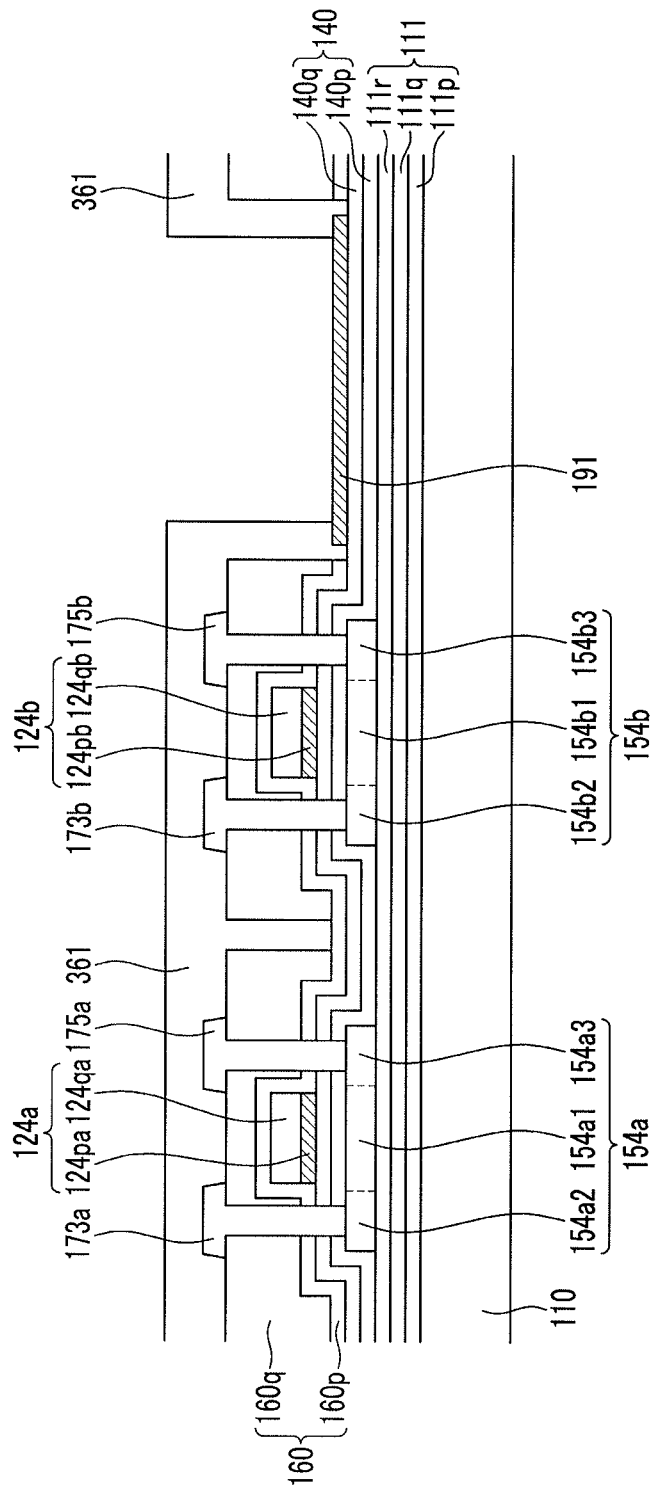
Figure 13:
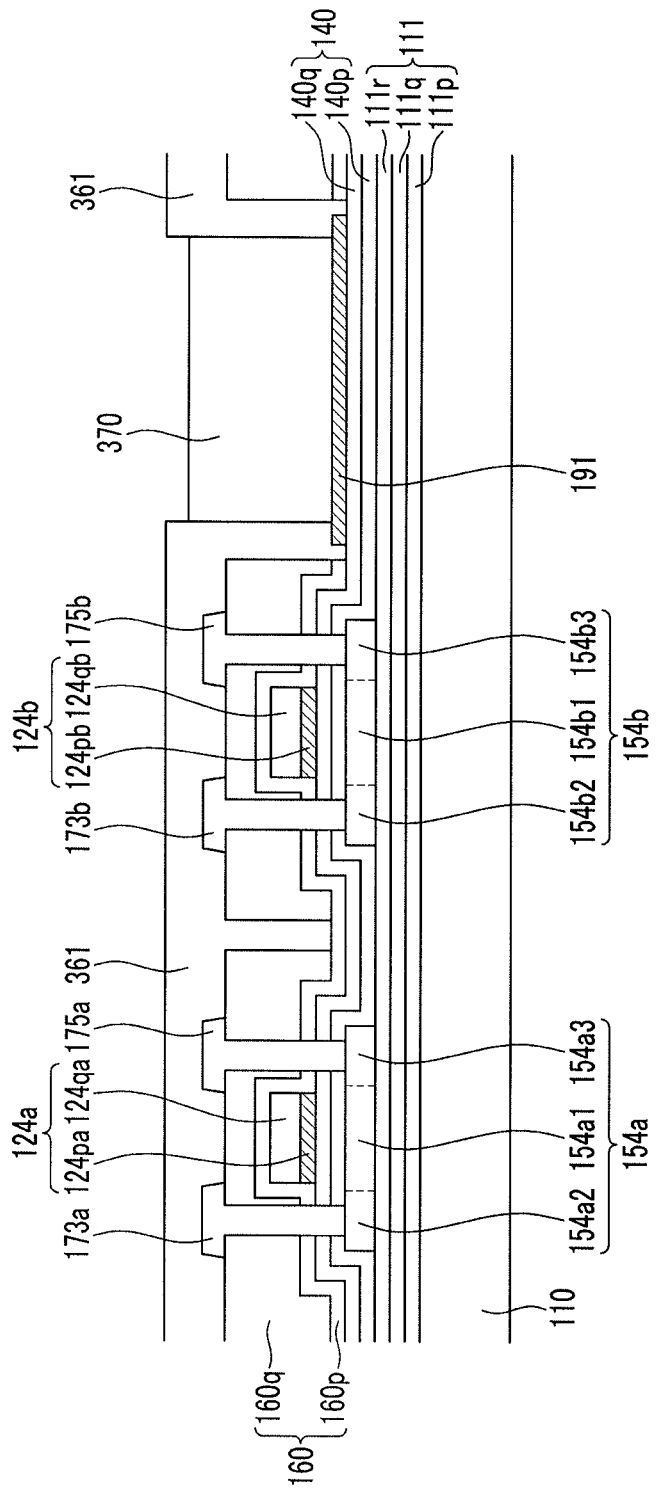

Referring to FIG. 12, the substrate structure is coated with an organic layer and then patterned to form the partition 361. Referring to FIG. 13, the organic emission layer 370 is stacked on the pixel electrode 191. Referring back to FIG. 1, the common electrode 270 is formed on the organic emission layer 370.

The following examples illustrate example embodiments in more detail. These examples, however, are not in any sense to be interpreted as limiting the scope of this disclosure.

Fabrication of an Organic Light Emitting Device

EXAMPLE 1

According to the embodiments described above, a thin film transistor was manufactured. Silicon oxide, silicon nitride, and silicon oxide layers were sequentially formed, as a buffer layer, on a glass substrate to have the following thicknesses respectively: 3000 Å, 600 Å, and 400 Å. The buffer layer was formed using CVD.

Next, a silicon oxide layer and a silicon nitride layer were sequentially deposited on a previously deposited silicon oxide layer of the buffer layer, as a gate insulating layer, using CVD. Each of the silicon oxide and silicon nitride layers of the gate insulating layer was 600 Å thick.

Next, ITO with a thickness of 300 Å, as a pixel electrode, was formed. Then, HT01 (Lu-dis Corporation) was deposited to be 65 nm thick on the pixel electrode, as a hole injection layer (HIL), L101 (LG Chem Ltd.) was deposited to be 5 nm thick as a second HIL thereon, and HT320 (Idemitsu Kosan) was deposited. Red, green, and blue emission layers were formed. Then, LiQ:LG201 (LG Chem Ltd. 1:1) was co-deposited to be 30 nm thick, as an electron transport layer, and Al was deposited thereon as an upper electrode.

EXAMPLE 2

An organic light emitting device was manufactured according to the same method as Example 1, except that the silicon nitride and silicon oxide of the buffer layer were formed to be 1000 Å, 2250 Å, and 600 Å thick on the glass substrate.

COMPARATIVE EXAMPLE 1

An organic light emitting device was manufactured according to the same method as Example 1, except that silicon nitride and silicon oxide were formed sequentially to be 1000 Å and 3000 Å thick as a buffer layer, and silicon oxide and silicon nitride were formed sequentially to be 800 Å and 400 Å as a gate insulating layer.

Evaluation

The OLED devices according to Example 1 and Comparative Example 1 were evaluated in terms of luminous efficiency and color coordinates. The luminous efficiency and color coordinates were evaluated using Keithley 2400 sourcemeter and PR-650, respectively. The results are shown in Table 1 below.

TABLE 1

|   |                       | Luminous Efficiency (cd/A) | Color coordinate X | Color coordinate Y |
|---|-----------------------|----------------------------|--------------------|--------------------|
| R | Example 1             | 44.6                       | 0.678              | 0.321              |
|   | Comparative Example 1 | 29.4                       | 0.683              | 0.316              |
| G | Example 1             | 45.2                       | 0.226              | 0.720              |
|   | Comparative Example 1 | 37.9                       | 0.281              | 0.665              |
| B | Example 1             | 2.77                       | 0.143              | 0.058              |
|   | Comparative Example 1 | 3.23                       | 0.142              | 0.073              |

Referring to Table 1, the OLED device of Example 1 had improved luminous efficiency and color coordinates in all of the red (R), green (G), and blue (B) regions, as compared with the OLED device of Comparative Example 1.

Figure 14:
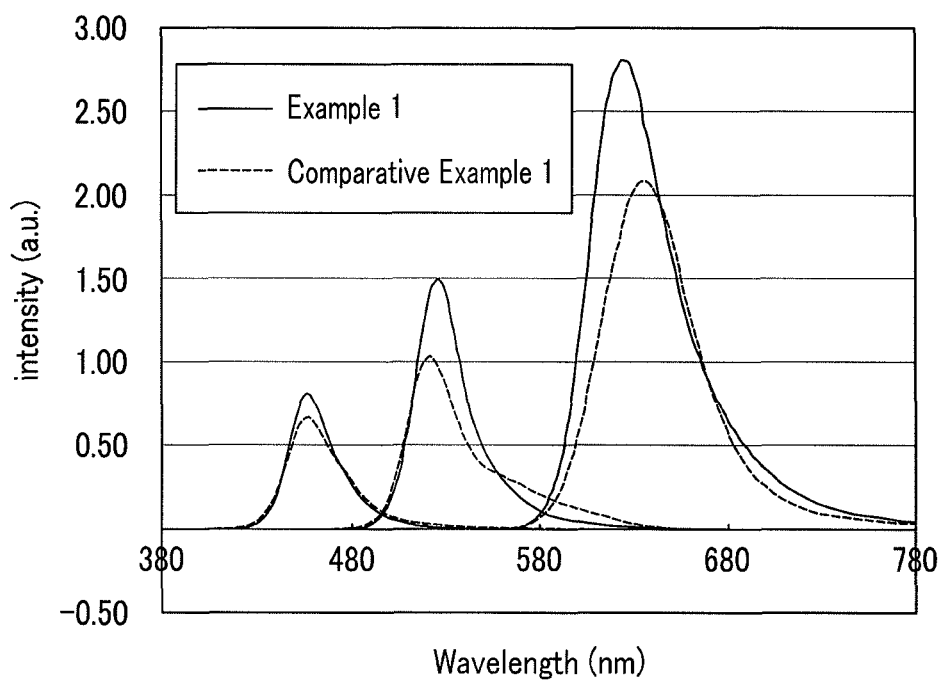
FIG. 14 illustrates light emitting spectra of OLED devices manufactured according to Example 1 and Comparative Example 1 at the same current level.

FIG. 14 illustrates a light emitting spectrum of the OLED devices manufactured according to Example 1 and Comparative Example 1 at the same current level. Referring to FIG. 14, the OLED device of Example 1 had stronger light emitting intensities and narrower light emitting wavelength ranges in all of the red, green, and blue colors, as compared to the OLED device of Comparative Example 1. From the results, it may be seen that the light emitting characteristics and color characteristics of the OLED device manufactured according to Example 1 were improved.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode device (OLED), comprising:
   a substrate;
   a transparent electrode disposed on the substrate, the transparent electrode including a portion in a light emitting region;
   an emission layer disposed on the transparent electrode;
   a reflecting electrode disposed on the emission layer;
   a gate insulating layer interposed between the substrate and the transparent electrode, the gate insulating layer including:
      a first inorganic dielectric layer having a thickness of about 1000Å or less, the first inorganic dielectric layer being in contact with the portion of the transparent electrode in the light emitting region, and
      a second inorganic dielectric layer between the first inorganic dielectric layer and the substrate, the first and second inorganic dielectric layers having different refractive indices; and
   a plurality of buffer layers interposed between the substrate and the gate insulating layer and including a lower buffer layer, an intermediate buffer layer and an upper buffer layer,
   wherein the light emitting region is defined only in a region having the emission layer in direct contact with the transparent and reflecting electrodes,
   wherein the upper buffer layer, the intermediate buffer layer, and the lower buffer layer are increasingly thicker from the upper buffer layer to the lower buffer layer, and
   wherein the first and second inorganic dielectric layers are stacked between the upper buffer layer and the portion of the transparent electrode in the light emitting region.

2. The OLED device of claim 1, wherein the first inorganic dielectric layer includes silicon nitride, and the second inorganic dielectric layer includes silicon oxide.

3. The OLED device of claim 2, wherein the first inorganic dielectric layer has a thickness of about 400 to 800 Å.

4. The OLED device of claim 3, wherein the second inorganic dielectric layer has a thickness of about 400 to 800 Å.

5. The OLED device of claim 1, wherein the lower buffer layer includes silicon oxide, the intermediate buffer layer includes silicon nitride, and the upper buffer layer includes silicon oxide.

6. The OLED device of claim 5, wherein the lower buffer layer has a thickness of about 3000Å or more.

7. The OLED device of claim 6, wherein each of the intermediate buffer layer and the upper buffer layer has a thicknesses of about 200 to 800 Å.

8. The OLED device of claim 1, further comprising a thin film transistor electrically connected to the transparent electrode, the thin film transistor including:
   a semiconductor layer having a source region, a channel region, and a drain region;
   a gate electrode overlapped with the channel region of the semiconductor layer with the gate insulating layer therebetween, the gate electrode including a transparent layer and a metal layer disposed on the transparent layer, each of the transparent layer of the gate electrode and the transparent electrode being directly on the gate insulating layer; and
   a source electrode and a drain electrode connected to the source region and the drain region, respectively.

9. The OLED device of claim 1, wherein the portion of the transparent electrode in the light emitting region is flat and parallel to the substrate, the gate insulating layer contacts and overlaps the entire portion of the transparent electrode in the light emitting region.

10. The OLED device of claim 1, wherein a contact surface between the portion of the transparent electrode and the gate insulating layer is in the light emitting region.

11. The OLED device of claim 1, wherein each of the first and second inorganic dielectric layers is completely below the transparent electrode, a lower surface of the transparent electrode being directly on the first inorganic dielectric layer.

12. The OLED device of claim 11, further comprising a thin film transistor electrically connected to the transparent electrode, the first and second inorganic dielectric layers continuously extending from the light emitting region to the thin film transistor to define a gate insulating layer of the thin film transistor.

13. The OLED device of claim 1, further comprising a thin film transistor electrically connected to the transparent electrode, the first and second inorganic dielectric layers continuously overlapping the entire light emitting region, the thin film transistor, and a region between the light emitting region and the thin film transistor.

14. A method of forming an organic light emitting diode device (OLED), comprising:
   forming a plurality of buffer layers on a substrate and including a lower buffer layer, an intermediate buffer layer and an upper buffer layer;
   forming a transparent electrode on the substrate, such that the transparent electrode includes a portion in a light emitting region;
   forming an emission layer on the transparent electrode;
   forming a reflecting electrode on the emission layer;
   forming a gate insulating layer interposed between the substrate and the transparent electrode, the gate insulating layer including:

a first inorganic dielectric layer having a thickness of about 1000Å or less, the first inorganic dielectric layer being in contact with the portion of the transparent electrode in the light emitting region, and a second inorganic dielectric layer between the first inorganic dielectric layer and the substrate, the first and second inorganic dielectric layers having different refractive indices, wherein the light emitting region is defined only in a region having the emission layer in direct contact with the transparent and reflecting electrodes, wherein the upper buffer layer, the intermediate buffer layer, and the lower buffer layer are increasingly thicker from the upper buffer layer to the lower buffer layer, and wherein the first and second inorganic dielectric layers are stacked between the upper buffer layer and the portion of the transparent electrode in the light emitting region.

15. The method of claim 14, further comprising:
forming a semiconductor layer on the plurality of buffer layers;
forming a gate electrode and the transparent electrode by sequentially stacking a transparent layer and a conductive layer on the gate insulating layer and performing a patterning process;
forming a source region, a channel region, and a drain region in the semiconductor layer;
partially removing the gate insulating layer to expose the source region and the drain region of the semiconductor layer;
removing the conductive layer of the transparent electrode;
forming a source electrode and a drain electrode connected to the source region and the drain region of the semiconductor layer, respectively;
forming the emission layer on the transparent electrode; and
forming the reflecting electrode on the emission layer.

16. The method of claim 15, wherein forming the first and second inorganic dielectric layers includes depositing a silicon nitride layer and a silicon oxide layer, respectively.

17. The method of claim 16, wherein forming the first inorganic dielectric layer includes depositing the silicon nitride layer to a thickness of about 400 to 800 Å.

18. The method of claim 17, wherein forming the second inorganic dielectric layer includes depositing a silicon oxide layer to a thickness of about 400 to 800 Å.

19. The method of claim 14, wherein forming the buffer layer includes forming the lower buffer layer to a thickness of about 3000 Å or more.

20. The method of claim 14, wherein forming the buffer layer includes forming each of the intermediate buffer layer and the upper buffer layer to a thickness of about 200 to 800 Å.

* * * * *